US009660205B2

(12) United States Patent
George et al.

(10) Patent No.: US 9,660,205 B2
(45) Date of Patent: May 23, 2017

(54) PROTECTIVE COATINGS FOR ORGANIC ELECTRONIC DEVICES MADE USING ATOMIC LAYER DEPOSITION AND MOLECULAR LAYER DEPOSITION TECHNIQUES

(75) Inventors: Steven M. George, Boulder, CO (US); Arrelaine Allen Dameron, Boulder, CO (US); Beau B. Burton, Columbia, MD (US); Markus D. Groner, Louisville, CO (US)

(73) Assignee: Regents of the University of Colorado, Denver, CO (US)

( * ) Notice: Subject to any disclaimer, the term of this patent is extended or adjusted under 35 U.S.C. 154(b) by 934 days.

(21) Appl. No.: 12/664,858

(22) PCT Filed: Jun. 22, 2008

(86) PCT No.: PCT/US2008/067823
§ 371 (c)(1),
(2), (4) Date: Dec. 15, 2009

(87) PCT Pub. No.: WO2009/002892
PCT Pub. Date: Dec. 31, 2008

(65) Prior Publication Data
US 2010/0178481 A1 Jul. 15, 2010

Related U.S. Application Data

(60) Provisional application No. 60/936,818, filed on Jun. 22, 2007.

(51) Int. Cl.
| | | |
|---|---|---|
| B32B 7/02 | (2006.01) | |
| C23C 16/22 | (2006.01) | |
| B05D 5/12 | (2006.01) | |
| H01L 51/00 | (2006.01) | |
| C23C 16/40 | (2006.01) | |
| C23C 16/455 | (2006.01) | |
| C23C 28/00 | (2006.01) | |
| C23C 28/04 | (2006.01) | |
| H01L 51/52 | (2006.01) | |

(52) U.S. Cl.
CPC ........ *H01L 51/0097* (2013.01); *C23C 16/402* (2013.01); *C23C 16/403* (2013.01); *C23C 16/45525* (2013.01); *C23C 28/00* (2013.01); *C23C 28/04* (2013.01); *C23C 28/42* (2013.01); *H01L 51/5256* (2013.01); *H01L 51/5237* (2013.01); *H01L 2251/5338* (2013.01); *Y02E 10/549* (2013.01); *Y10T 428/2495* (2015.01); *Y10T 428/26* (2015.01)

(58) Field of Classification Search
CPC ............. B32B 7/02; B05D 5/12; C23C 16/22

USPC ........................................................ 428/323
See application file for complete search history.

(56) References Cited

U.S. PATENT DOCUMENTS

| | | |
|---|---|---|
| 4,842,892 A | 6/1989 | Smith |
| 4,954,371 A | 9/1990 | Yializis |
| 5,116,703 A * | 5/1992 | Badesha et al. ............. 430/58.6 |
| 5,260,095 A | 11/1993 | Affinito |
| 7,074,501 B2 * | 7/2006 | Czeremuszkin et al. ..... 428/690 |
| 7,426,067 B1 | 9/2008 | Bright |
| 7,553,686 B2 | 6/2009 | George |
| 2003/0129929 A1 | 7/2003 | Monaka et al. |
| 2003/0203210 A1 | 10/2003 | Graft |
| 2003/0204038 A1 * | 10/2003 | Xiao et al. ...................... 528/10 |
| 2004/0265253 A1 * | 12/2004 | Seo et al. ......................... 424/63 |
| 2005/0158590 A1 * | 7/2005 | Li .................................. 428/698 |
| 2005/0223989 A1 * | 10/2005 | Lee et al. ....................... 118/722 |
| 2006/0250084 A1 | 11/2006 | Cok |
| 2007/0049155 A1 | 3/2007 | Moro et al. |

FOREIGN PATENT DOCUMENTS

| | | |
|---|---|---|
| WO | 02-071506 A | 9/2002 |
| WO | WO 03038143 A1 * | 5/2003 |
| WO | 2006/014591 A | 2/2006 |

OTHER PUBLICATIONS

Du, "Molecular Layer Deposition of Nylon 66 Films Examined Using In Situ FTIR Spectroscopy", J. Physical Chemistry C vol. 111 pp. 8509-8517 (2007).
Du and George, "Molecular layer deposition of nylon 66 film . . . ", J. Phys. Chem C2007, 111, 8509-8517.
Adamczyk et al., "Molecular layer deposition of poly(p-phenylene terphthalamide) films . . . ", Langmuir 2008, 2, 2081-2089.
Dameron et al., "Gas Diffusion Barriers on Polymers Using Multilayers Fabricated by Al2O3 . . . ", J. Phys. Chem. C 2008, 112, 4573-4580.
Dameron et al., "Molecular Layer Deposition of ALucone Polymer Films . . . ", Chem. Mater. 2008, 20, 3315-3326.
Cordero et al., "Channel cracks in a hermetic coating . . . ", Appl. Phys. Letters. 90, 111910 (2007).

* cited by examiner

*Primary Examiner* — Cheng Huang
(74) *Attorney, Agent, or Firm* — Arendt & Associates Intellectual Property Group; Jacqueline Arendt

(57) ABSTRACT

Coatings are applied on a flexible substrate using atomic layer deposition and molecular layer deposition methods. The coatings have thickness of up to 100 nanometers. The coatings include layers of an inorganic material such as alumina, which are separated by flexibilizing layers that are deposited with covalent chemical linkage to the inorganic material and which are one or more of silica deposited by an atomic layer deposition process; an organic polymer that is deposited by a molecular layer deposition process, or a hybrid organic-inorganic polymer that is deposited by an molecular layer deposition process.

3 Claims, No Drawings

PROTECTIVE COATINGS FOR ORGANIC ELECTRONIC DEVICES MADE USING ATOMIC LAYER DEPOSITION AND MOLECULAR LAYER DEPOSITION TECHNIQUES

This application claims priority from U.S. Provisional Patent Application No. 60/936,818, filed 22 Jun. 2007.

This invention relates to protective coatings for flexible substrates such as flexible polymeric substrates and to methods for making those coatings. In certain embodiments, this invention relates to gas diffusion barriers for flexible organic electronic devices and to methods of making such gas diffusion barriers.

Coatings are often applied to various substrates to provide protections from mechanical, radiation and chemical damage, or to provide some functionality to the substrate. For example, gas diffusion barrier films are sometimes applied to organic electronic devices in flexible displays, in order to protect the devices from contaminants, oxygen, moisture or other potentially damaging materials.

One specific application is in flexible organic electronic devices (FOEDs) such as flexible organic light emitting devices (FOLEDs). FOEDs and FOLEDs often fail because they are degraded by oxygen and water. These oxidants degrade the organics and lead to the oxidation of the metal cathode. To protect the polymer film from oxidative attack, inorganic materials such as silica ($SiO_2$) and alumina ($Al_2O_3$) can be used to coat the device and provide a gas diffusion barrier. Silica and alumina films with thicknesses of 100-300 Å can be deposited using sputtering or evaporation, but these do not provide an adequate gas diffusion barrier. These films typically exhibit $H_2O$ transmission rates of ~0.05 $g/m^2/day$. In contrast, maximum allowable $H_2O$ transmission rates of ~$1\times10^{-6}$ $g/m^2/day$ are required to achieve the target OLED lifetime of 10,000 hours. The silica or alumina films, then exhibit water transmission rates some 5000 times as high as is needed.

The high transmission rates of these films are believed to be related to their manufacturing process. The inorganic layers in previous multilayer barriers have been deposited using line-of-sight sputtering techniques. Sputtered films are known to have pinholes because of the random nature of line-of-sight deposition. These pinholes are believed to be responsible for the high transmission rates through the films.

Simply forming thicker films does not resolve this problem, because these inorganic materials usually display no significant gain in permeability reduction beyond a critical thickness of 100-300 Å. This critical thickness is the result of defects and propagation of grain boundaries, which continue to exist even as the film grows thicker. In many cases, greater film thickness cannot be tolerated as it interferes with the function of the device by, for example, blocking light or other electromagnetic radiation from penetrating through the inorganic layers. Greater film thicknesses are also more susceptible to film cracking during flexure.

Although single inorganic films prepared by sputtering can not obtain $H_2O$ transmission rates of ~$1\times10^{-6}$ $g/m^2/day$, another approach has been to form various types of inorganic multilayer structures on plastic substrates. The thickness of the individual inorganic layers has been limited to ≤100 Å because these inorganic layers become brittle at larger thicknesses and can crack when the plastic substrate is flexed.

One design for a flexible multiple barrier of inorganic layers is an inorganic/polymer multilayer architecture, in which inorganic barrier layers alternate with flexible polymer layers. The organic layers are intended to help keep the inorganic layers from cracking. Such an approach is described, for example, in U.S. Pat. Nos. 4,842,892, 4,954,371, 5,260,095 and, more recently US Published Patent Application 2003/0203210. US 2003/0203210 describes multilayer coatings with alternating inorganic and organic layers. The inorganic layers are from 5 to 50 nm thick, whereas the organic layers are significantly thicker, being at least 100 nm thick and up to one micron thick. The inorganic layers are applied by sputtering methods, and the organic layer is applied using a vapor deposition process. This process is incapable of forming extremely thin layers, is limited primarily to line-of-sight application, and is prone to form granular films that tend to have many defects. The sputtering and chemical vapor deposition methods to not permit the adjacent inorganic and organic layers to develop strong covalent bonds to each other, and as a result the adjacent layers are not strongly adhered to each other.

Furthermore, the relatively thick organic layers described in US 2003/0203210 are not very effective in preventing cracks from forming and propagating in the inorganic layers. Starting from theoretical considerations Cordero et al., in "Channel cracks in a hermetic coating consisting of organic and inorganic layers", *Applied Physics Letters* 90, 111910 (2007). conclude that to be highly effective, the organic layers should be on the order of about 25 to 75% of the thickness of the inorganic layers. This reference by Cordero is incorporated herein by reference. Cordero et al. did not describe any method for actually producing such thin organic layers.

Therefore, what is desired is a method for preparing a flexible substrate with an inorganic coating which is resistant to cracking or forming defects when the substrate is flexed. The coating more preferably has very low permeability to oxygen and water. The adjacent layers should be bonded covalently to each other in order to increase the bond strength between the layers.

This invention is in one aspect a flexible substrate having a coating, wherein the coating includes
a) at least two layers of an inorganic material other than silica, each of said layers having a thickness of from 5 to 100 nanometers and being produced by an atomic layer deposition process, and
b) a flexibilizing layer or layers interposed between each adjacent pair of layers of the inorganic material, the flexibilizing layer or layers having a total thickness of from 10 to 150% of the thickness of the thicker of said adjacent pair of layers of the inorganic material, wherein the flexibilizing layer is:
b-1) silica which is deposited by an atomic layer deposition process;
b-2) an organic polymer that is deposited by a molecular layer deposition process,
b-3) a hybrid organic-inorganic polymer that is deposited by an atomic layer deposition process;
layer of two or more of b-1, b-2 and b-3.

The inorganic material is preferably alumina (nominally $Al_2O_3$), but may be another metal oxide such as titanium dioxide or zirconia, a metal or semi-metal nitride, or other inorganic material. All that is required is that the inorganic material be capable of being deposited as a film having a thickness of from 5 to 100 nanometers via an atomic layer deposition method, at a temperature that is low enough that the substrate is not softened, melted or degraded.

It is also preferred that the layers formed in steps a) and b) are covalently bonded to each other. The layer forming in the initial step a) preferably is covalently bonded to the substrate, but in some case may not be, if the substrate does not have functional groups that can react with one of the precursor materials that are used in the atomic layer deposition process to produce that layer.

Thus, in one embodiment, the flexible substrate has alternating layers of silica and the inorganic material, especially alternating layers of alumina and silica. The silica layer preferably is deposited by a rapid atomic layer deposition process, as described more fully below.

In other embodiments, the coating contains alternating layers of the inorganic material and of an organic polymer that is made by a molecular layer deposition process. The organic polymer layers are preferably no greater than 50 nanometers thick. Even more preferably, the organic polymer layers are no thicker than 75% of the thickness of the thicker of the adjacent pair of inorganic layers.

In still other embodiments, the coating contains alternating layers of the inorganic material and of a hybrid organic-inorganic polymer. The inorganic layers and the hybrid organic-inorganic polymer layers are deposited using atomic layer deposition and molecular layer deposition methods. The hybrid organic-inorganic polymer layers are preferably no greater than 50 nanometers thick. Even more preferably, the hybrid organic-inorganic polymer layers are no thicker than 75% of the thickness of the thicker of the adjacent pair of inorganic layers.

In still other embodiments, the coating contains multiple layers of the inorganic material, wherein at least some of the adjacent layers of the inorganic material are separated from each other by at least one silica layer and at least one layer of an organic polymer, the silica layer being deposited by an ALD process and the organic polymer layer being deposited by a molecular layer deposition process. In one particular embodiment of this type, the coating contains layers in a repeating ABC pattern, where A represents the inorganic material, B represents a silica layer and C represents an organic polymer layer.

In still other embodiments, the coating contains multiple layers of the inorganic material, wherein at least some of the adjacent layers of the inorganic material are separated from each other by at least one silica layer and at least one layer of a hybrid organic-inorganic polymer, the silica layer and the hybrid organic-inorganic layers each being deposited by an ALD or MLD process. In one particular embodiment of this type, the coating contains layers in a repeating ABD pattern, where A represents the inorganic material, B represents a silica layer and D represents the hybrid organic-inorganic polymer layer. These flexible coatings are in many cases substantially free of defects and resistant to developing cracks and other defects when the coated substrate is flexed. In many cases, the coating will display exceptional gas diffusion barrier properties. The individual alumina layers formed in the ALD process have much better gas diffusion barrier properties than alumina layers formed in a sputtering process. Silica flexibilizing layers are believed to be able to close the few defects in the $Al_2O_3$ ALD layer. This is particularly true when the silica flexibilizing layer is deposited in a rapid ALD process as described more below. In addition, the layer of a silica flexibilizing layer protects the $Al_2O_3$ ALD layer from $H_2O$ corrosion. Organic or hybrid inorganic/organic polymer flexibilizing layers perform a flexibilizing function and can be tuned to obtain a higher critical strain before cracking than the polymer layers used in previous multilayer barriers. As a result, highly flexible coated substrates can be prepared, which have very low permeabilities to water and oxygen. As a result, the devices are more resistant to ordinary handling, and have lifetimes in the order of years or tens of years.

The invention is also a method for making the foregoing coated substrate, comprising a) depositing a 5-100 nanometer layer of alumina on a surface of a flexible substrate using an atomic layer deposition method, b) depositing at least one flexibilizing layer upon the alumina layer deposited in step a), by performing at least one of b-1), b-2), b-3)

b-1) depositing a silica layer by an atomic layer deposition process;

b-2) depositing a layer of an organic polymer by a molecular layer deposition process, b-3) depositing a layer of a hybrid organic-inorganic polymer by a molecular layer deposition process; and c) using an atomic layer deposition process, depositing a 5-100 nanometer layer of alumina directly or indirectly on top of the flexibilizing layer formed in step b), wherein the flexibilizing layer or layers is deposited to a total thickness deposited in step b) has a thickness of from 10 to 150%, of the thickness of the thicker of the adjacent layer of the inorganic material.

In certain embodiments, steps b) and c) are each repeated one or more times to form a stack of alternating inorganic and flexibilizing layers.

In certain embodiments of the process of the invention, step b) is conducted by depositing a layer of silica. When steps b) and c) are repeated, the flexible substrate becomes coated alternating layers of silica and the inorganic material, especially alternating layers of alumina and silica.

In other embodiments of the process of the invention, step b) is conducted by depositing a layer of an organic polymer by molecular layer deposition. When steps b) and c) are repeated, the coating contains alternating layers of the inorganic material and of the organic polymer. The organic polymer layers are preferably no greater than 50 nanometers thick. Even more preferably, the organic polymer layers are no thicker than 75% of the thickness of the thicker of the adjacent pair of inorganic layers. The inorganic layers formed in steps a) and c) are preferably alumina.

In other embodiments of the process of the invention, step b) is conducted by depositing a layer of a hybrid organic-inorganic polymer by molecular layer deposition. When steps b) and c) are repeated, the coating contains alternating layers of the inorganic material and of the hybrid organic-inorganic polymer. The hybrid organic-inorganic polymer layers are preferably no greater than 50 nanometers thick. Even more preferably, the hybrid organic-inorganic polymer layers are no thicker than 75% of the thickness of the thicker of the adjacent pair of inorganic layers. The inorganic layers formed in steps a) and c) are preferably alumina.

In other embodiments of the process of the invention, step b) is conducted by depositing a layer of silica by atomic layer deposition and a layer of an organic polymer by molecular layer deposition. When steps b) and c) are repeated, the coating contains layers of the inorganic material which are separated by a layer of silica and a layer of an organic polymer. In one particular embodiment of this type, the inorganic, silica and organic copolymer layers are applied in to form a coating that contains the respective layers in a repeating ABC pattern, where A represents the inorganic material, B represents a silica layer and C represents an organic polymer layer. The total thickness of the silica and organic polymer layers is preferably no greater than 50 nanometers thick. Even more preferably, the total thickness of the silica layer and the organic polymer layer is no thicker than 75% of the thickness of the thicker of the adjacent pair of inorganic layers. The inorganic layers formed in steps a) and c) are preferably alumina.

The substrate can be any flexible material. By "flexible", it is meant that the substrate is capable of being bent with a bend radius of 1 inches (about 2.5 cm) or less, preferably of 0.1 inches (2.5 mm) or less and even more preferably 0.03 inches (1 mm) or less. The coated substrate will generally be similarly flexible without forming significant cracks or other defects in the coating.

The substrate is preferably an organic polymer and is more preferably a flexible organic electronic device (FOED). The FOED is a film of an organic material, typically a polymer, which has desirable electrical properties. The FOED may be, for example, an organic transistor, an organic conductor, or a light emitting diode. Flexible organic light-emitting diodes (FOLEDs) are of particular interest. The functional organic material is connected to a cathode and an anode that supply an operating voltage. The OED is typically supported on one side with a substrate. The substrate may be ultrathin glass, a flexible polymer or a flexible metal. Glass and metal substrates can provide very good barriers to water and oxygen, and so one side of the OED is often protected. The top side of the OED, however, typically requires encapsulation to protect it against water and oxygen.

In this invention, a 5-100 nanometer layer of an inorganic material, preferably alumina, is deposited over the substrate. The inorganic layer is preferably from 5 to 75 angstroms thick and more preferably from 10 to 50 angstroms thick. The inorganic layer may be deposited directly onto the substrate. Alternatively, one or more intervening layers may be present.

The inorganic layer applied to the substrate in step a) preferably becomes covalently bonded to the substrate. Covalent bonding can occur when the first-to-be-applied precursor compound reacts under the conditions of the atomic layer deposition process with a functional group on the surface of the substrate. Examples of such functional groups are, for example, hydroxyl, carbonyl, carboxylic acid, carboxylic acid anhydride, carboxylic acid halide, primary or secondary amino, and the like.

The inorganic layer is deposited using atomic layer deposition methods. The atomic layer deposition process is characterized in that at least two different reactants are needed to form the coating layer. The reactants are introduced into the reaction zone individually, sequentially and in the gas phase. Excess amounts of reactant are removed from the reaction zone before introducing the next reactant. Reaction by-products are removed as well, between successive introductions of the reagents. This procedure ensures that reactions occur at the surface of the substrate, rather than in the gas phase.

A purge gas is typically introduced between the alternating feeds of the reactants, in order to further help to remove excess reactants. A carrier gas, which is usually but not necessarily the same as the purge gas, generally (but not always necessarily) is introduced during the time each reactant is introduced. The carrier gas may perform several functions, including (1) facilitating the removal of excess reactant and reaction by-products and (2) distributing the reactant through the reaction zone, thereby helping to expose all surfaces to the reactant. The purge gas must be non-oxidizing. The purge gas does not react undesirably with the ALD reactants or the deposited coating, or interfere with their reaction with each other at the surface of the substrate.

A typical pattern of introducing reactants (in a two-reagent ALD reaction scheme) is:
1. Optionally, introduce purge gas.
2. Introduce mixture of carrier gas and first reagent.
3. Introduce purge gas and/or pull a vacuum to remove excess quantities of the first reagent as well as reaction by-products. Typically, a monolayer of the reagent remains chemisorbed on the substrate surface following this step.
4. Introduce mixture of carrier gas and second reagent.
5. Introduce purge gas and/or pull a vacuum to remove excess quantities of the second reagent and reaction by-products. As before, this leaves a monolayer of chemisorbed reagent on the surface of the substrate.
6. Repeat steps 2-5 until desired coating thickness is obtained.

As mentioned, the same material may be used as the purge gas and each carrier gas. It is also possible to use different materials.

Analogous patterns are used when the film-forming reaction involves more than two reagents, or when a catalyzed reaction system is used. Such atomic layer controlled growth techniques permit the formation of deposits of up to about 0.3 nm in thickness per reaction cycle, and thus provide a means of extremely fine control over deposit thickness. The reactions are self-limited and can be repeated to sequentially deposit additional layers of the deposited material until a desired thickness is achieved.

Reaction conditions are selected mainly to meet two criteria. The first criterion is that the reagents are gaseous under the conditions of the reaction. Therefore, temperature and pressure conditions are selected such that the reactants are volatilized. The second criterion is one of reactivity. Conditions, particularly temperature, are selected such that the desired reaction between the film-forming reagents (or, at the start of the reaction, the first-introduced reagent and the substrate surface) occurs at a commercially reasonable rate.

The temperature of the reactions may range from 273-1000K, but below the temperature at which any of the reactants degrades, and below the temperature at which any of the applied layers degrades. The temperature is also below the glass transition temperature of the substrate. A preferred temperature is no more than 500K, and a more preferred temperature is no more than 423K.

Specific temperature and pressure conditions will depend on the particular reaction system, as it remains necessary to provide gaseous reactants. Subatmospheric pressures will normally be required.

The progress of the reaction can be monitored using techniques such as transmission Fourier transform infrared techniques, quartz crystal microbalance measurements and X-ray photoelectron spectroscopy.

ALD processes for preparing alumina are described, for example, in A. C. Dillon et al, "Surface Chemistry of $Al_2O_3$ Deposition using $Al(CH_3)_3$ and $H_2O$ in a Binary reaction Sequence", *Surface Science* 322, 230 (1995) and A. W. Ott et al., "$Al_2O_3$ Thin Film Growth on Si(100) Using Binary Reaction Sequence Chemistry", *Thin Solid Films* 292, 135 (1997). Both of these references are incorporated herein by reference. A specific reaction sequence that produces alumina is:

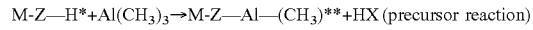

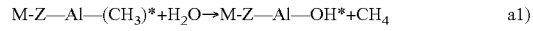

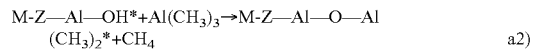

This particular sequence of reactions is particularly preferred to deposit alumina, as the reactions proceed well even at temperature below 350° K. This particular reaction sequence tends to deposit $Al_2O_3$ ALD at a rate of ~1.2 Å per reaction cycle. Triethyl aluminum (TEA) can be used in place of trimethyl aluminum. The implementation and understanding of $Al_2O_3$ ALD on polymers has been described by C. A. Wilson et al., "Nucleation and Growth during $Al_2O_3$ Atomic Layer Deposition on Polymers", *Chemistry of Materials* 17, 5625 (2005). This reference is incorporated herein by reference.

In the first iteration of step a), M and Z in the foregoing set of reactions represent a metal, semi-metal or carbon atom and a heteroatom such as oxygen or nitrogen, respectively, which reside at the surface of the substrate. A covalent bond is formed between the substrate and the inorganic layer that is formed the first time step a) is performed. If step a) is repeated one or more times after step b) is performed, then M and Z instead represent a metal, semi-metal or carbon atom and a heteroatom such as oxygen or nitrogen, respectively, which reside at the surface of silica, organic polymer or hybrid organic-inorganic polymers which is applied in step b. In this case, a covalent bond is formed between the inorganic layer and the underlying silica, organic polymer or hybrid organic-inorganic polymer layer.

In certain embodiments, a silica layer is deposited atop the layer of the inorganic material to form a barrier bilayer. This layer is also deposited using ALD methods like those described above, other than the selection of reagents. A high temperature ALD method for producing silica is described, for example, in J. W. Klaus et al, "Atomic Layer Controlled Growth of $SiO_2$ Films Using Binary Reaction Sequence Chemistry", *Appl. Phys. Lett.* 70, 1092 (1997) and O. Sheh et al., "Atomic Layer Growth of $SiO_2$ on Si(100) and $H_2O$ using a Binary Reaction Sequence", *Surface Science* 334, 135 (1995), both incorporated herein by reference. A lower temperature ALD method of producing silica is described, for example, in J. W. Klaus et al, "Atomic Layer Controlled $SiO_2$ Growth at Room Temperature Using Catalyzed Binary Reaction Sequence Chemistry", *Science* 278, 1934 (1997) and Y. Du et al., "$SiO_2$ Film Growth at Low Temperatures by Catalyzed Atomic Layer Deposition in a Viscous Flow Reactor", *Thin Solid Films* 491, 43 (2005), both incorporated herein by reference. The catalytic low temperature $SiO_2$ ALD would be especially applicable for deposition on most polymer substrates.

A suitable reaction scheme for depositing silica layers is described by the following equations, in which M represents a metal or semimetal atom on the substrate, Z is oxygen, sulfur or nitrogen, and X is a displaceable nucleophilic group (especially chlorine):

  precursor reaction

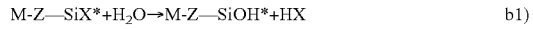  b1)

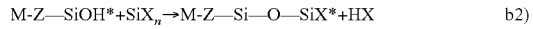  b2)

In the foregoing precursor reaction, the M and Z atoms in most cases will be metal or semi metal and oxygen atoms, respectively, on at the surface of the inorganic layer that is applied in step a). In this manner, a covalent bond is produced between the inorganic layer and the superimposed silica layer.

In a particularly preferred process, a so-called "rapid" ALD process is used to deposit the layer of the second inorganic material silica layer. In the rapid ALD process, layers of up to ~120 angstroms in thickness can be deposited over an alumina substrate in a single reaction cycle. A bis- or tris(alkoxyl)silanol is used as a reagent in the rapid ALD process to make the preferred silica layer. The second reagent is suitably trimethylaluminum or triethylaluminum. The silanol reagent tends to form multiple layers on the underlying surface, which are believed to be polymerized there in part due to catalytic effects of the underlying aluminum atoms. The reaction continues until access to the underlying catalytic center is no longer accessible, at which time the reaction is completed and another exposure to the aluminum-containing reagent is required. The rapid ALD process for depositing silica is described, for example, by Hausmann et al. in "Rapid Vapor Deposition of Highly Conformal Silica Nanolaminates", *Science* 298, 202 (2002), and by Dameron et al., "Gas Diffusion Barriers on Polymers Using Multilayers Fabricated by $Al_2O_3$ and Rapid $SiO_2$ Atomic Layer Deposition", *J. Phys. Chem. C* 2008, 112, 4373 (2008). Both of these references are incorporated herein by reference.

The rapid ALD technique for depositing silica is believed to be particularly effective in filling pinholes and other small defects which tend to exist in the alumina layer. It is believed that these defects are due at least in part to the presence of very small particles that are present on the surface of the OED as the alumina layer is deposited. Subsequent removal of these particles creates pinholes of ~0.1 micron to up to 5 microns or more in diameter. By filling these pinholes with silica, the process "patches" defects in the alumina layer and improves its barrier properties. The barrier properties of and alumina/silica bilayer formed in this manner have been found to be significantly better than would be expected from the performance of these layers individually. In addition, the silica layer can act as a passivating layer which protects the alumina from being exposed to water.

The rapid $SiO_2$ ALD technique involves a silanol molecule that is easily condensed on the surface to form a multilayer. The pinholes may be particularly susceptible to condensing a silanol multilayer via a capillary condensation mechanism. Consequently, the pinholes may attract silanol molecules that preferentially condense in the pinholes and produce rapid $SiO_2$ growth in the pinholes. Other inorganic materials may also preferentially fill the pinholes during a rapid ALD process resulting from a similar capillary condensation. In such a manner, the rapid ALD process could fill pinholes that are much larger in diameter than the typical growth rates for rapid ALD on flat surfaces.

The rapid ALD technique may be applied to the formation of the other inorganic layers in steps a) and/or c). Metal hydroxyl species that are expected to show similar behavior are zirconol, titanol and aluminol gas phase compounds. These metals are known to form stable metal oxides $ZrO_2$, $TiO_2$ and $Al_2O_3$, respectively. Other metal hydroxyl species may also be candidates for rapid ALD. The hydroxyl functionality is expected to form multilayers easily because of hydrogen bonding. However, other functionalities such as the —$NH_2$ (amino) and —SH (thiol) may also promote multilayer formation and lead the deposition of metal nitrides and metal sulfides that may show the similar rapid ALD characteristics.

In other embodiments of the invention, inorganic layers or alumina-silica barrier bilayers are separated by a flexibilizing layer of an organic polymer or a hybrid organic-inorganic polymer layer. This flexibilizing layer has strong chemical adhesion through chemical covalent bonds to the inorganic material. The organic polymer or hybrid organic-inorganic layer has a thickness of from 10 to 150%, preferably from 25 to 75% of that of the thicker of the two adjacent inorganic layers, and preferably is no thicker than 50 nm, especially no more than 25 nm. If the adjacent inorganic layers are of the same thickness, the thickness of the organic polymer or hybrid organic-inorganic layer from 10 to 150%, preferably from 25 to 75% of each of the adjacent layers.

The organic polymer layer is prepared by a molecular layer deposition (MLD) process. The molecular layer deposition process is characterized by several features, which are similar to those described before with respect to the ALD process. All reagents are applied in the vapor phase. The reagents are applied to the substrate sequentially, i.e., one after the other, rather than simultaneously. Excess reagent, if any, is removed from the reaction zone prior to introduction of the next reagent. This prevents reactions from occurring at places other than the surface of the substrate, such as in the vapor phase.

All reaction by-products produced in the molecular layer deposition process are preferably gasses or have a vapor pressure of at least 1 millitorr, preferably at least 1 Torr, at the temperature at which the process is conducted. This facilitates removal of the by-products from the reaction zone and minimizes or prevents the by-products from condensing on the substrate or reactor surfaces.

General methods for forming polymer layers by molecular layer deposition are described, for example, by Du et al., "Molecular Layer Deposition of Nylon 66 Films Examined Using in Situ FTIR Spectroscopy", *J. Phys. Chem. C* 111, 8509 (2007); Adamczyk et al., "Molecular Layer Deposition of Poly(p-phenylene terephthalate) Films Using Terephthaloyl Chloride and p-Phenylenediamine", *Langmuir* 24, 2081 (2008). Both of these references are incorporated herein by reference. Methods for forming polymer layers by molecular layer deposition are also described in WO 06/271126 A.

The organic polymer may be an -A-B-type polymer, which is formed using at least two different vapor phase reactants. In those embodiments, the two vapor phase reactants are introduced in an alternating and sequential manner. Each reaction cycle introduces an additional -A-B— unit onto the polymer chain, with the total number of -A-B— units in the chain being determined by the number of times the reaction sequence is repeated.

The vapor phase reactants used to produce -A-B— polymers in the molecular layer deposition process should have several characteristics. The first of these is that the reactants are gasses or else have a vapor pressure of at least 1 millitorr at the temperature at which the reaction is conducted. The vapor phase reactants preferably have a vapor pressure of at least 1 Torr at such temperature. The second characteristic is that the vapor phase reactants can react with a functional group supplied (directly or indirectly) by the other vapor phase reactant to form a bond to the growing polymer chain. "Directly" here means that the functional group is formed when the vapor phase reactant reacts with the polymer chain, whereas "indirectly" means that the functional group is formed only after further reaction of a functional group precursor that is formed when the vapor phase reactant reacts.

The third characteristic is that upon reacting with the polymer chain, the vapor phase reactants each produce either (1) a functional group with which the other vapor phase reactant can react to grow the polymer chain or (2) a precursor to such a functional group. The fourth characteristic is that the vapor phase reactants react only monofunctionally with the polymer chain, i.e., only one group or moiety on the vapor phase reactant is capable of reacting with a polymer chain under the conditions of the reaction. This prevents unwanted cross-linking or chain termination that can occur when a vapor phase reactant can react polyfunctionally. A reactant is considered to react "monofunctionally" if during the reaction the reaction forms a bond to only one polymer chain, and does not self-polymerize under the reaction conditions employed.

In other embodiments, the polymer is a homopolymer of a single vapor phase reactant. In such a case, the vapor phase reactant should have characteristics as just described, with the exception that the vapor phase reactant can react with a functional group supplied by itself (again directly or indirectly) to bond to the polymer chain.

In addition, at least one of the reactants used to make the organic polymer layer should react with a functional group at the surface of the underlying layer to form a covalent bond between the organic polymer layer and the underlying layer.

Several types of reactants have these characteristics and those which are gasses or have vapor pressures as described can be used herein.

One type of reactant is a compound having two different reactive groups, one of which is reactive with a functional group on the polymer chain and one of which does not react with a functional group on the polymer chain but is reactive with another of the vapor phase reactants. Another type of reactant is a cyclic molecule that reacts with a particular functional group on the polymer chain and then opens up to yield a new functional group.

Examples of reactants that have two different reactive groups or undergo ring-opening include, for example:

a) Cyclic azasilanes. These can react with a hydroxyl group to form a silicon-oxygen bond and generate a free primary or secondary amino group upon ring-opening. An example of such a material is 2,2-dimethoxy-1,6-diazasilacyclooctane b) Cyclic carbonates, lactones and lactams. The carbonates can react with a primary or secondary amino group to form a urethane linkage and generate a free hydroxyl group upon ring-opening. The lactones and lactams can react with a primary or secondary amino group to form an amide linkage and generate a free hydroxyl or amino group, respectively, upon ring-opening. Ethylene carbonate, for example, can be used with the cyclic azasilanes described in a) to form polyamides. Such a reaction is described in Adamcyzk et al., *Langmuir* 24, 2081 (2008).

c) Hydroxyl compounds having vinyl or allylic unsaturation. These can react with a carboxylic acid, carboxylic acid halide, or siloxane group to form an ester or silicone-oxygen bond and introduce vinyl or allylic unsaturation onto the polymer chain. Alternatively, the unsaturated group can react with a primary amino group in a Michael addition reaction to extend the polymer chain and introduce a hydroxyl group onto the chain. The unsaturated groups can alternatively be oxidized to form a functional group such as a carboxylic acid, an epoxide or a carboxylic acid anhydride, all of which can react with a hydroxyl group of another molecule of the unsaturated hydroxyl compound, or with other amino or isocyanate compounds. An example of a hydroxyl compound of this type is 3-butene-1-ol. A scheme for forming a polymer of 3-butene-1-ol via molecular layer deposition is described in Adamcyzk et al., *Langmuir* 24, 2081 (2008).

d) Aminoalcohol compounds. The amino group can react with a carboxyl group, a carboxylic acid chloride, a vinyl or allylic group, or an isocyanate group, for example, to extend the polymer chain and introduce a hydroxyl group onto the chain. Alternatively, the hydroxyl group can react with a siloxane species to form a silicon-oxygen bond and introduce a free primary or secondary amino group onto the polymer chain.

The foregoing are illustrative only, as a large number of other bifunctional monomers can be used in similar manner.

A second type of reactant contains two different reactive groups, both of which are reactive with a functional group on the polymer chain, but one of which is much more highly reactive with that functional group. This allows the more reactive of the groups to react with the functional group on the polymer chain while leaving the less reactive group unreacted and available for reaction with another vapor phase reactant.

A third type of reactant contains two reactive groups, one of which is blocked or otherwise protected such that it is not available for reaction until the blocking or protective group is removed. The blocking or protective group can be removed chemically in some cases, and in other cases by thermally decomposing the blocking group to generate the underlying reactive group. The unprotected group may be, for example, an amino group, anhydride group, hydroxyl group, carboxylic acid group, carboxylic anhydride group, carboxylic acid ester group, isocyanate group and the like. The protected group may be one which, after removal of the protective group, gives rise to a functional group of any of the types just mentioned. The reactant may, for example, have a hydroxyl group protected by a leaving group such as a benzyl, nitrobenzyl, tetrahydropyranyl, —CH$_2$OCH$_3$ or similar group. In these cases, the hydroxyl group can be deprotected in various ways, for example by treatment with HCl, ethanol, or in some cases, irradiation. Carboxyl groups can be protected with leaving groups such as —CH$_2$SCH$_3$, t-butyl, benzyl, dimethylamino and similar groups. These groups can be deprotected by treatment with species such as trifluoroacetic acid, formic acid, methanol or water to generate the carboxylic acid group. Amino groups can be protected with groups such as R—OOC—, which can be removed by reaction with trifluoroacetic acid, hydrazine or ammonia. Isocyanate groups can be protected with carboxyl compounds such as formic acid or acetic acid.

A fourth type of reactant contains a first functional group, and a precursor group at which a further reaction can be conducted to produce a second functional group. In such a case, the first functional group reacts to form a bond to the polymer chain, and chemistry is then performed at the precursor group to generate a second functional group. The first functional group can be any of the types mentioned before, including a siloxane group, amino group, anhydride group, hydroxyl group, carboxylic acid group, carboxylic anhydride group, carboxylic acid ester group, isocyanate group and the like. A wide variety of precursor groups can be present on this type of reactant. The requirements for the precursor group is that it does itself react with the polymer chain, but it can be converted to a functional group that can react with another monomer to grow the chain. Two notable types of precursor groups are vinyl and/or allylic unsaturation, and halogen substitution, especially chlorine or bromine. Vinyl and allylic unsaturation can be converted to functional groups using a variety of chemistries. These can react with ozone or peroxides to form carboxylic acids or aldehydes. They can also react with ammonia or primary amino to produce an amine or imine. Halogens can be displaced with various functional groups. They can react with ammonia or primary amine to introduce an amino group, which can in turn be reacted with phosgene to produce an isocyanate group, if desired.

An example an MLD reaction is that of 2,2-dimethoxy-1,6-diaza-2-silacyclooctane, a cyclic azasilane hereafter referred to as AZ, and ethylene carbonate. These react to form a polyurethane. In the first step, the AZ reacts with a hydroxyl-functionalized surface atom and creates a silicon-oxygen bond. Additionally, the AZ unfolds leaving a primary amine surface species. In the second step, the ethylene carbonate reacts with the primary amine and generates a urethane linkage. The ethylene carbonate subsequently unfolds and produces a hydroxylated surface, which can react with more of the AZ to start the process over again and increase the molecular weight of the polymer. This reaction is described in Adamcyzk et al., *Langmuir* 24, 2081 (2008).

An example of another MLD reaction is that of 3-(1,3-dimethylbutylidene)aminopropyltriethoxysilane (PS) with an acid chloride. In the first step, a hydroxylated surface is exposed to PS. The PS binds to the surface through a siloxane linkage. A protecting group hides the —NH$_2$ functionality until the protecting group is removed. Exposure of the PS surface to water removes the protecting group. In particular, the water reacts with the imine moiety and releases 4-methyl-2-pentanone. This reaction leaves a surface terminated with primary amine groups. The surface can then be exposed to an acid chloride such as 1-(o-nitrobenzyl)-3-oxyheptanoyl chloride. This acid chloride precursor adds to the surface via an amide linkage. This addition yields a nitrobenzyl-protected surface. The nitrobenzyl-protecting group hides an underlying hydroxyl group. The hydroxyl group then can be deprotected by exposure to ultra-violet (UV) light at 320 nm. The UV light removes the nitrobenzyl group and unmasks the hidden hydroxyl chemical functionality. The reaction sequence can then proceed with another exposure to PS. In this manner, a polyamide resin of desired molecular weight and thickness can be formed.

Other polymer layers can be deposited using analogous methods.

In still other embodiments, alumina layers or barrier bilayers are separated by a flexibilizing layer of a hybrid organic-inorganic polymer. The hybrid organic-inorganic polymer has strong chemical adhesion as a result of direct chemical covalent bonds to the inorganic material. The hybrid organic-inorganic polymer layer is prepared by an MLD process as described by Dameron et al. "Molecular Layer Deposition of Alucone Polymer Films Using Trimethylaluminum and Ethylene Glycol, *Chemistry of Materials* 20, 3315 (2008). This reference by Dameron is incorporated herein by reference.

A hybrid organic-inorganic polymer can be viewed as a linear or branched chain structure having metal or semi-metal repeating units which alternate with organic units. The repeating units can be schematically represented by the idealized structure:

[-M-Z—R—Z—]$_n$          (I)

wherein M represents a metal or semi-metal atom, each Z is independently a linking group that contains at least one heteroatom, and R represents an organic diradical, preferably hydrocarbyl diradical or an inertly substituted hydrocarbyl diradical. By 'inertly substituted', it is meant that the R group contains no substituent which interferes with its ability to form an alternating chain structure with the M atom. In structure I, n represents the degree of polymerization.

In structure I, Z is preferably oxygen, sulfur or —NR$^1$— where R$^1$ is hydrogen, phenyl or lower alkyl, but may also be another linking group, such as carboxylate (—O—C(O)— or carbonyl that can form a bond to the M atom. The Z group is preferably bonded covalently to the M atom, rather than ionically. The most preferred Z group is oxygen, as oxygen tends to form the strongest bonds to the M atoms, for most metals M.

The M atom can be one or more of a wide range of metals and semimetals. The metal or semimetal should be polyvalent, capable of forming one or more compounds that can be used as precursors in the MLD process, and should form strong covalent bonds with oxygen, nitrogen or sulfur, preferably oxygen. The metal preferably forms halides, and/or forms compounds with alkyl groups (metal alkyls), alkenes or dienes, which can be volatilized under some conditions of temperature and pressure at which the compounds are thermally stable. Many metals within IUPAC groups 2-12 are suitable, as are metals such as gallium, indium, germanium, tin, lead, antimony or bismuth. Examples of suitable metals include IUPAC group 2 metals such as magnesium, calcium, strontium and barium, IUPAC group 4 metals such as titanium and zirconium, IUPAC group 7 metals such as manganese, IUPAC group 8-10 transition metals (iron, nickel, cobalt and the like), IUPAC group 12 metals such as zinc and cadmium, IUPAC group 13 metals and semimetals such as aluminum, gallium and indium, as well as antimony and bismuth. Zinc and aluminum are especially preferred.

The R group is preferably a divalent or polyvalent hydrocarbyl group or substituted hydrocarbyl group. A substituted hydrocarbyl group may contain ether, ester, carbonate, urethane, or other linking groups. It may be substituted with inert substituents such as halogen, nitro, —$SO_2$— and other groups. If the R group is polyvalent, it will be bonded to 3 or more Z groups which, in turn, will be bonded to 3 or more M atoms, in which case the R group will represent a branch point in the polymer structure. It is not necessary that each R group be the same. For example, a mixture of divalent and trivalent R groups may be used if desired. This provides a mechanism for controlling the level of branching in the polymer.

The R group is small enough that the vapor phase reactant can be volatilized at a temperature at which it does not degrade. The R group typically will contain no more than 20 carbon atoms, more preferably no more than 15 carbon atoms and more preferably no more than 10 carbon atoms.

Structure I is idealized, and simplified, being intended to illustrate the alternating and repeating arrangement of metal and organic groups in the organic-inorganic polymer. Structure I omits other substituents that may be present, and does not indicate branching or crosslinking points which may be included within the polymer structure. For example, the M atom may be bonded to other substituents, including any substituents Y (as defined below) as may have been present on the starting material. M may be bonded to one or more oxygen atoms which may also be bonded to other M atoms, as needed to fulfill valence requirements for the particular metal M. Note also that in some cases the M atom can be bound to three or more —Z—R—Z— groups, in which case the M atoms represent a branching point in the polymer structure. In some cases, one or more X groups from the starting material may remain bonded to the M atoms. It is also possible that at least some of the M atoms are divalently bonded to a —Z—R—Z— group to form a cyclic structure.

Hybrid organic-inorganic polymers of particular interest have chain structures in which a metal atom alternates with —O—R—O— groups, wherein R is $C_2$-$C_6$ alkylene, —$C_mH_{2m}$—O—$C_mH_{2m}$—, where m is from 2 to 6, phenylene or

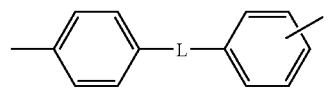

where L is a covalent bond, —S—, —S—S—, —SO—, —$SO_2$—, —$CO_3$— —CO— or —O— or a divalent hydrocarbon group suitably having from 1 to about 10, preferably from 1 to about 5, more preferably from 1 to about 3 carbon atoms. The metal M in these polymers of particular interest is an IUPAC group 2 metal such as magnesium, calcium, strontium and barium, an IUPAC group 4 metal such as titanium and zirconium, and IUPAC group 7 metal such as manganese, an IUPAC group 8-10 transition metal (iron, nickel, cobalt and the like), and IUPAC group 12 metal such as zinc and cadmium, and IUPAC group 13 metal or semimetal such as aluminum, gallium and indium, or antimony or bismuth. As before, zinc and aluminum are especially preferred.

The hybrid organic-inorganic polymer is prepared using MLD methods, similar to those described above. The regents include at least one reagent $Y_{(p-a)}MX_a$, wherein X represents a nucleophilic leaving group, a is a number from 2 to p, p represents the valence of M and Y is an inert substituent other than a nucleophilic leaving group. a is preferably equal to p, the valence of M. Note that when a=p, the reagent takes the form $MX_p$. Suitable groups X include halogen, especially chlorine, alkyl groups such as methyl, ethyl, t-butyl and the like and conjugated dienes such as butadiene and cyclopentadiene. Examples of $MX_p$ compounds include compounds such as trimethylaluminum, zirconium tetrachloride, silicon tetrachloride, titanium tetrachloride, diethyl zinc, tetra(dimethylamino)zirconium, and the like. Various metal cyclopentadienyl compounds are also useful, such as ferrocene ($Fe(C_p)_2$), nickelocene (Ni $(C_p)_2$) and cobaltocene ($Co(C_p)_2$), (where Cp represents a cyclopentadienyl ligand), as well as cyclopentadienyl complexes of manganese, magnesium and the like.

One type of organic precursor used to prepare hybrid organic-inorganic polymers by MLD reactions corresponds to HZ—R—ZH, wherein Z and R are as before. Dihydroxy compounds are preferred among these types, although diamines and dithiol compounds can be used as well in some cases, as can dicarboxylic acids, dicarboxylic acid halides, and the like. Among the preferred dihydroxy compounds are alkylene glycols such as ethylene glycol, 1,2-propylene glycol, 1,3-propane diol, 1,4-butane diol, 1,6-hexane diol and the like, as well as glycol ethers such as diethylene glycol, triethylene glycol, dipropylene glycol and the like. Diphenol materials having two phenolic —OH groups, such as 1,4-dihydroxybenzene (catechol) resorcinol, hydroquinone, tetramethylbiphenol, and the various bisphenol compounds (such as bisphenol, bisphenol A, bisphenol AP (1,1-bis(4-hydroxylphenyl)-1-phenyl ethane), bisphenol F, bisphenol K, bisphenol M, and the like) are also useful.

It is also possible to use a polyvalent organic starting material in place of or in conjunction with the divalent types just described. Polyvalent organic starting materials contain at least three H—Z— groups and thus can react with three metal atoms and introduce branching into the polymer chain. Polyhydroxyl compounds of this type include trimethylolpropane, glycerine, pentaerythritol and the like.

An example of an MLD reaction sequence to produce a hybrid organic-inorganic polymer can be represented by the following idealized equations:

$M^1$-Z—H*+$MX_a$→M-Z-MX*+HX    (precursor reaction)

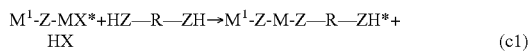

$$M^1\text{-}Z\text{-}MX^* + HZ\text{—}R\text{—}ZH \rightarrow M^1\text{-}Z\text{-}M\text{-}Z\text{—}R\text{—}ZH^* + HX \quad (c1)$$

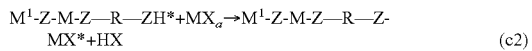

$$M^1\text{-}Z\text{-}M\text{-}Z\text{—}R\text{—}ZH^* + MX_a \rightarrow M^1\text{-}Z\text{-}M\text{-}Z\text{—}R\text{—}Z\text{-}MX^* + HX \quad (c2)$$

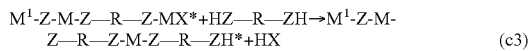

$$M^1\text{-}Z\text{-}M\text{-}Z\text{—}R\text{—}Z\text{-}MX^* + HZ\text{—}R\text{—}ZH \rightarrow M^1\text{-}Z\text{-}M\text{-}Z\text{—}R\text{—}Z\text{-}M\text{-}Z\text{—}R\text{—}ZH^* + HX \quad (c3)$$

Further repetitions of the binary reaction extends the polymer chain, increasing molecular weight and the thickness of the hybrid organic-inorganic polymer layer.

Another type of organic reagent has one functional group which can react at an -M-X moiety to displace the X group and form a covalent bond to the M atom, and at least one precursor group which can be converted to such a functional group. The precursor group itself does not react at an -M-X site, but can be converted to a functional group that can react at that site. The precursor group may be, for example a blocked functional group that, when the blocking group is removed, forms a H—Z— functional group.

A blocking or protective group can be removed chemically in some cases, and in other cases by thermally decomposing the blocked group to generate the underlying reactive group. An example of a blocked functional group is a hydroxyl group protected by a leaving group such as a benzyl, nitrobenzyl, tetrahydropyranyl, —CH$_2$OCH$_3$ or similar group. In these cases, the hydroxyl group can be deprotected in various ways, for example by treatment with HCl, ethanol, or in some cases, irradiation. Carboxyl groups can be blocked with leaving groups such as —CH$_2$SCH$_3$, t-butyl, benzyl, dimethylamino and similar groups. These groups can be deprotected by treatment with species such as trifluoroacetic acid, formic acid, methanol or water to generate the carboxylic acid group. Amino groups can be blocked with groups such as R—OOC—, which can be removed by reaction with trifluoroacetic acid, hydrazine or ammonia.

Alternatively, the precursor group is simply a reactive site at which a subsequent reaction can be conducted to generate a group that is reactive at an -M-X site. Two notable types of precursor groups are vinyl and/or allylic unsaturation, and halogen substitution, especially chlorine or bromine. Vinyl and allylic unsaturation can be converted to functional groups using a variety of chemistries. These can react with ozone or peroxides to form carboxylic acids or aldehydes. They can also react with ammonia or primary amines to produce an amine or imine. Halogens can be displaced with various functional groups. An example of a reagent having such a precursor group is 3-buten-1-ol.

3-buten-1-ol contains a hydroxyl group, which reacts with the metal at the surface of the substrate, and a vinyl group, which in this reaction scheme is a functional group precursor which can be converted to a functional group (a carboxyl, epoxide or aldehyde) by oxidation with ozone. Thus, for example, a hybrid organic-inorganic polymer can be formed using trimethylaluminum (TMA) and 3-buten-1-ol. The surface of the substrate is exposed to the TMA, forming a layer having surface —Al—CH$_3$ groups. Subsequent exposure to 3-buten-1-ol causes the hydroxylated end of the molecule to react with the aluminum atom to create an Al—O bond. This reaction displaces methane. When this reaction occurs, the double bond on the other end of the 3-buten-1-ol is orientated away from the surface. Next, the double bond is activated by exposure to ozone to form a carboxylic acid. The hydroxyl of the carboxylic acid is then ready to be reacted once again with TMA. This sequence of reactions is described by Adamczyk et al., *Langmuir* 24, 2081 (2008).

At least one of the reactants used to make the hybrid organic-inorganic polymer layer should react with a functional group at the surface of the underlying layer to form a covalent bond between the hybrid organic-inorganic polymer layer and the underlying layer.

The following examples are provided to illustrate the invention but are not intended to limit the scope thereof. All parts and percentages are by weight unless otherwise indicated.

EXAMPLE 1

A 25-nanometer-thick layer of alumina is deposited onto a poly(ethylene naphthalate) substrate via atomic layer deposition, using trimethyl aluminum and water as the reagents in the binary reaction. Water vapor transmission rates are measured for the coated substrate, using tritiated water as a radioactive tracer, according to general methods described by Coulter et al, *J. Membrane Science* 65, 269 (1992) and by Hansen et al., *Progress in Organic Coatings* 44, 259 (2002). Rates are measured with the alumina coating facing up (away from the saturated atmosphere, and again facing down (towards the saturated atmosphere). Water vapor transmission rates in the two cases are about $1 \times 10^{-3}$ g/m$^2$/day in the former case and 2-3 orders of magnitude greater in the latter case.

A 60 nanometer-thick silica film is then deposited atop the alumina layer on another sample of the alumina-coated film. This produces a barrier bilayer with a total thickness of 85 nm. Rapid atomic layer deposition is used to deposit the film, using tris(tert-pentoxy)silanol as the reagent. Water vapor transmission rates are evaluated for this film, again with the film oriented in each direction. Transmission rates are about $1 \times 10^{-4}$ g/m$^2$/day in each case. This represents an order of magnitude improvement over the film that has only the alumina layer.

When a 60 nm silica film is deposited directly onto the poly(ethylene naphthalate) substrate, water vapor transmission rate is about $1 \times 10^{-1}$ g/m$^2$/day. The predicted water vapor transmission rate for the film with both the alumina and the silica layers is therefore about $9.9 \times 10^{-4}$ g/m$^2$/day, or about that of the alumina film by itself. The nearly order of magnitude better performance for the silica film on the alumina film is therefore considered to be a surprising result.

When a second, identical barrier bilayer is deposited over the film, the water vapor transmission rate falls even farther, to the range of $5 \times 10^{-5}$ g/m$^2$/day. In this case, water vapor transmission falls with total thickness, as expected. When a third and fourth bilayer pair are deposited in identical fashion, water vapor transmission rates are seen to rise. This is believed to be due to the increasing brittleness of the deposited films as they, in effect, become thicker. It is believed that cracks form in the deposited film structure as the film is manipulated for testing. A more complete description of these results is given in Dameron et al., "Gas Diffusion Barriers on Polymers Using Multilayers Fabricated by Al$_2$O$_3$ and Rapid SiO$_2$ Atomic Layer Deposition", *J. Phys. Chem. C* 2008, 112, 4373 (2008).

The cracking problem can be overcome by depositing an organic polymer film or a hybrid organic-inorganic polymer film between each of the bilayer pairs, in the manner described before.

EXAMPLE 2

An aluminum-based hybrid organic-inorganic polymer film is of particular interest in this invention, in part because certain aluminum-containing precursors (such as TMA or triethylaluminum) can be used to prepare an alumina layer and the hybrid organic-inorganic polymer layer. Therefore, production can be switched easily from depositing alumina to producing the hybrid organic-inorganic layer, merely by changing the second precursor from water to, for example, an alkylene glycol such as ethylene glycol.

Based on this production strategy, a 25-nanometer-thick layer of alumina is deposited onto a poly(ethylene naphthalate) substrate via atomic layer deposition, using trimethyl aluminum and water as the reagents in the binary reaction. Water vapor transmission rates are measured for the coated film, using tritiated water as a radioactive tracer as described in Example 1. Rates are measured with the alumina coating facing away from the saturated atmosphere. Water vapor transmission rates are ~$1 \times 10^{-3}$ g/m$^2$/day.

A 15 nanometer-thick hybrid organic-inorganic film formed from the molecular layer deposition reaction of trimethyl aluminum and ethylene glycol is then deposited atop the alumina layer on another sample of the alumina-coated poly(ethylene naphthalate) substrate. This hybrid polymer can be described as poly(aluminum ethylene glycol) as discussed by Dameron et al. "Molecular Layer Deposition of Alucone Polymer Films Using Trimethylaluminum and Ethylene Glycol, *Chemistry of Materials* 20, 3315 (2008). Water vapor transmission rates are measured for the coated film, using tritiated water as a radioactive tracer as described in Example 1. Rates are measured with the alumina coating facing away from the saturated atmosphere. Water vapor transmission rates are ~$1 \times 10^{-3}$ g/m$^2$/day. The poly(aluminum ethylene glycol) alucone MLD layer alone does not improve the water vapor transmission rate.

An additional 25-nanometer-thick layer of alumina is deposited onto an poly(aluminum ethylene glycol) alucone MLD film on another alumina film on the poly(ethylene naphthalate) substrate via atomic layer deposition, using trimethyl aluminum and water as the reagents in the binary reaction. This trilayer has film thicknesses of 25 nm alumina/15 nm poly(aluminum ethylene glycol) alucone/25 nm alumina. Water vapor transmission rates are again measured for the trilayer-coated film, using tritiated water as a radioactive tracer as described in Example 1. Rates are measured with the alumina coating facing away from the saturated atmosphere. Water vapor transmission rates are ~$1 \times 10^{-4}$ g/m$^2$/day. The second alumina layer has reduced the water vapor transmission rate for the trilayer about one order of magnitude.

EXAMPLE 3

Organic polymer films can also be utilized to prepare a alternating layers of alumina and organic polymers. An Al$_2$O$_3$ ALD film is first grown on the KBr substrate by atomic layer deposition to create a hydroxylated alumina surface. The hydroxylated alumina surface is exposed to aminopropyltriethoxysilane (APS) to introduce primary amino groups onto the surface. Nylon 66 MLD is then performed using the procedures described by Du et al., "Molecular Layer Deposition of Nylon 66 Films Examined Using in Situ FTIR Spectroscopy", *J. Phys. Chem. C* 111, 8509 (2007).

A second layer of Al$_2$O$_3$ ALD is then grown on the first nylon 66 MLD layer at 83° C. Following another APS surface treatment of the Al$_2$O$_3$ ALD film, a second nylon 66 MLD layer is grown on the second Al$_2$O$_3$ ALD layer at the same temperature. This procedure is continued until our layers of Al$_2$O$_3$ ALD and three layers of nylon 66 MLD were deposited on the KBr substrate. An FTIR beam passed through the KBr substrate at near normal incidence and detected the multilayers on each side of the substrate.

FTIR is performed during the growth of each Al$_2$O$_3$ layer. Absorbance from Al$_2$O$_3$ bulk vibrational features appear in the FTIR spectrum over a broad range from 600-1000 cm$^{-1}$. The absorbance in this region increases progressively with the growth of each Al$_2$O$_3$ ALD layer. The FTIR spectra also reveals C—H stretching vibrations at 2800-3000 cm$^{-1}$ and Amide I and Amide II vibrations at 1650 and 1560 cm$^{-1}$, respectively. These features are consistent with the nylon 66 MLD layers that are deposited between each Al$_2$O$_3$ ALD layer. The first Al$_2$O$_3$ ALD layer is grown using 90 reaction cycles. The second, third and fourth Al$_2$O$_3$ ALD layers were grown using 80, 100 and 100 reaction cycles, respectively. The growth of the integrated absorbance of the Al$_2$O$_3$ bulk feature is linear with the number of reaction cycles. This linear relationship indicates that Al$_2$O$_3$ ALD nucleates easily on the nylon 66 MLD layers.

FTIR is performed after the growth of each nylon 66 MLD layer. Absorbance from nylon 66 vibrational features appeared in the FTIR spectrum. Vibrational peaks for the N—H and C—H stretching vibrations, Amide I and Amide II vibrations appear as expected for a nylon 66 layer. The absorbance of the nylon 66 MLD features increases progressively with the growth of each nylon 66 MLD layer. The first nylon 66 MLD layer is grown using 40 reaction cycles. The second and third nylon 66 MLD layers are grown using 29 and 30 reaction cycles, respectively. The growth of the integrated absorbance of the nylon 66 absorption features is linear with the number of AB cycles. This linear relationship indicates that nylon 66 nucleates readily on the APS-functionalized Al$_2$O$_3$ ALD layers.

EXAMPLE 4

Inorganic/organic multilayers of TiO$_2$/nylon 66 are grown on a poly(methylmechacrylate)-coated quart crystal microbalance (QCM) crystal. The TiO$_2$ layers are produced using TiCl$_4$ and H$_2$O as the reactants, as described by M. Ritala et al., "Growth of Titanium Dioxide Thin Films by Atomic Layer Epitaxy", *Thin Solid Films* 225, 288 (1993). The nylon 66 MLD is performed as described by Du et al., "Molecular Layer Deposition of Nylon 66 Films Examined Using in Situ FTIR Spectroscopy", *J. Phys. Chem. C* 111, 8509 (2007). The reactions are performed at a temperature of 95° C. to stay below the Tg of PMMA.

What is claimed is:
1. A coated flexible substrate comprising a flexible substrate having a coating, wherein the coating includes
   a) at least two layers of an inorganic material other than silica, each of said layers having a thickness of from 10 to 50 angstroms and being produced by an atomic layer deposition process, and
   b) a flexibilizing layer interposed between each adjacent pair of layers of the inorganic material, the flexibilizing layer having a total thickness of from 10 to 75% of the thickness of the thicker of said adjacent pair of layers of the inorganic material, wherein the flexibilizing layer is a hybrid organic-inorganic polymer that is deposited by a molecular layer deposition process, wherein the hybrid organic-inorganic polymer is a linear or branched chain structure having metal or semi-metal repeating units which alternate with organic units, the hybrid organic-inorganic polymer having the structure

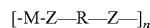

wherein M represents a metal or semi-metal atom selected from, magnesium, calcium, strontium, barium, titanium, zirconium, manganese, iron, nickel, cobalt, zinc, cadmium, aluminum, gallium, indium, germanium, tin, lead, antimony or bismuth, each Z is independently a linking group that contains at least one a heteroatom, R represents a hydrocarbyl or inertly substituted hydrocarbyl group and n represents the degree of polymerization.

2. The coated flexible substrate of claim 1 wherein the inorganic material is alumina and the metal M is aluminum.

3. The coated flexible substrate of claim 1, wherein the flexible substrate is a flexible organic light emitting device.

* * * * *